United States Patent [19]
Little et al.

[11] Patent Number: 5,267,071
[45] Date of Patent: Nov. 30, 1993

[54] SIGNAL LEVEL CONTROL CIRCUITRY FOR A FIBER COMMUNICATIONS SYSTEM

[75] Inventors: Frank R. Little, Alpharetta; John G. Megna, Lilburn; Heather H. Rand, Alpharetta; Frederick T. Zendt, Norcross, all of Ga.

[73] Assignee: Scientific-Atlanta, Inc., Norcross, Ga.

[21] Appl. No.: 754,029

[22] Filed: Sep. 3, 1991

[51] Int. Cl.$^5$ .................................. H04B 10/00
[52] U.S. Cl. ................... 359/154; 359/161; 359/187; 359/194; 359/133; 330/59; 330/284; 250/214 A
[58] Field of Search .............. 359/154, 157, 161, 173, 359/180, 187-189, 194-195, 132-133; 330/59, 308, 284; 250/214 A

[56] References Cited
U.S. PATENT DOCUMENTS

| | | | |
|---|---|---|---|
| 3,210,681 | 10/1965 | Rhodes | 330/32 |
| 3,296,463 | 1/1967 | Brault | 307/88.5 |
| 3,327,238 | 6/1967 | Harwood | 330/31 |
| 3,329,904 | 7/1969 | Horwitz | 330/21 |
| 4,092,610 | 5/1978 | White et al. | 330/207 |
| 4,301,543 | 11/1981 | Palmer | 455/612 |
| 4,376,267 | 3/1983 | Chu | 330/284 |
| 4,397,042 | 8/1983 | Tsujii et al. | 359/194 |
| 4,415,803 | 11/1983 | Muoi | 250/214 |
| 4,535,233 | 8/1985 | Abraham | 250/214 |
| 4,553,105 | 11/1985 | Sasaki | 330/284 |
| 4,563,656 | 1/1986 | Baum | 330/308 |
| 4,564,818 | 1/1986 | Jones | 330/311 |
| 4,609,880 | 9/1986 | Determitzakis et al. | 330/308 |
| 4,620,321 | 10/1986 | Chown | 455/619 |
| 4,641,378 | 2/1987 | McConnell et al. | 455/619 |
| 4,647,762 | 3/1987 | Chown | 250/214 |
| 4,718,119 | 1/1988 | Salzer et al. | 359/194 |
| 4,750,216 | 6/1988 | Boyce | 455/617 |
| 4,750,217 | 6/1988 | Smith et al. | 455/619 |
| 4,752,745 | 6/1988 | Pass | 330/265 |
| 4,761,549 | 8/1988 | Mealer, III et al. | 250/214 |
| 4,771,325 | 9/1988 | Cheng et al. | 357/30 |
| 4,855,687 | 8/1989 | Hebert | 330/304 |
| 4,857,725 | 8/1989 | Goodnough et al. | 250/214 |
| 4,897,615 | 1/1990 | Chen et al. | 330/263 |
| 4,968,948 | 11/1990 | Tokumo et al. | 330/10 |
| 4,998,012 | 3/1991 | Kruse | 250/214 |
| 5,013,903 | 5/1991 | Kasper | 250/214 |
| 5,095,286 | 3/1991 | Cole et al. | 330/308 |

FOREIGN PATENT DOCUMENTS

| | | |
|---|---|---|
| 0185199 | 6/1986 | European Pat. Off. . |
| 0405419 | 1/1991 | European Pat. Off. . |
| 0025333 | 1/1988 | Fed. Rep. of Germany . |
| 53-142154 | 11/1978 | Japan . |
| 56-85944 | 7/1981 | Japan . |
| 63-250928 | 10/1988 | Japan . |
| 63-301686 | 12/1988 | Japan . |
| 0209029 | 8/1990 | Japan .................... 359/194 |
| WO9108631 | 6/1991 | PCT Int'l Appl. . |

OTHER PUBLICATIONS

Gareth F. Williams & Herve P. LeBlanc, "Active Feedback Lightwave Receivers" in Optical Fiber Communication Conference Technical Digest 118-20, (Feb. 24-26, 1986).

Primary Examiner—Richard E. Chilcot, Jr.
Assistant Examiner—Kinfe-Michael Negash
Attorney, Agent, or Firm—William A. Marvin; Frederick W. Powers, III

[57] ABSTRACT

A system for signal level control in AM fiber systems is provided. The system provides level controls at both transmitter and receiver ends of the fiber transmission system, utilizing compensation and control techniques at each end to maintain and optimize the performance of the system. The transmitter includes two stage level control based on a composite power level of a detected RF signal. The receiver includes two stage level control based on a pilot channel filtered from the channels transmitted to the receiver.

28 Claims, 9 Drawing Sheets

SIGNAL LEVEL CONTROL CIRCUITRY FOR A FIBER COMMUNICATIONS SYSTEM

FIELD OF THE INVENTION

The present invention relates to fiber communications systems and, more particularly, to methods and apparatus for signal level control in a fiber communications system such as a CATV system.

BACKGROUND OF THE INVENTION

In recent years, there has been a great deal of interest in the transmission of video signals via optical fibers. This mode of signal transmission offers a number of advantages over transmitting signals by conventional coaxial cable video signal distribution as is now commonly accomplished in CATV systems. Optical fibers intrinsically have more information-carrying capacity than do coaxial cables. In addition, there is less signal attenuation in optical fibers than in coaxial cable adapted for carrying radio frequency (RF) signals. Consequently, optical fibers can span longer distances between signal regenerators than is possible with coaxial cable. In addition, the dielectric nature of optical fiber eliminates any problems with electrical shorting. Finally, optical fiber is immune to ambient electromagnetic interference (EMI) and generates no EMI of its own.

Amplitude modulation, or more specifically, intensity modulation, of an optical signal by a wideband radio frequency signal requires a light modulating device, such as a laser, which has linear characteristics over a wide dynamic range of operation. Until recently it has been difficult to fabricate lasers in which the relationship between input current and optical output was linear over more than an extremely limited range. Because of this difficulty in obtaining lasers which were sufficiently linear to support analog intensity modulation, digital intensity modulation was, until recently, the primary means for transmitting information by optical signals. However, recent advances in laser technology have made analog intensity modulation of optical signals feasible. Currently available Fabry-Perot (FP) and Distributed Feedback (DFB) lasers have sufficiently linear characteristics to allow them to be used as analog modulators of optical signals.

An important advantage of AM fiber systems for CATV is that the same multichannel NTSC, PAL, or SECAM signal format is maintained throughout the system. No format conversion electronics are required at either end of the optical link. This makes the AM fiber optic system "friendly" to the CATV system tie-in points. Because of this advantage, AM fiber optic systems generally require less equipment space in the installation. An AM system is also less costly to install, particularly on a per channel basis, than either FM or digital systems.

The single mode optical fiber used in AM fiber systems possesses attenuation characteristics which change extremely little with temperature variations, unlike coaxial cable. In most current AM fiber architectures, little compensation for the optical fiber response is required. However, the carrier-to-noise ratio (CNR) and intermodulation distortion performance (composite triple beat, composite second order) of AM fiber systems is tied directly to the relative level of the multichannel carriers which modulate the laser. Because of this, the issue of signal level control is important throughout initial equipment set-up, ongoing operation, and system maintenance.

The signals modulating an AM laser have certain ideal requirements. The laser used in the transmitter exhibits optimum performance for a given application when operated at a specific composite modulation index. The RF drive level per channel modulating the laser is the determining factor in the composite modulation index of the laser. Ideally, the modulation index of the laser should be precisely maintained at its optimum value to ensure specified system carrier-to-noise ratio and intermodulation distortion performance. If the laser modulation index is too large, the CNR performance improves, but the distortion performance is compromised. On the other hand, if the laser modulation index is too small, the distortion performance improves, but the CNR performance is compromised.

In general, a larger composite modulation index is required to meet higher system CNR specifications. However, a maximum modulation index exists for each laser. Above this index, laser distortion performance begins to deteriorate rapidly due to signal clipping. In high CNR performance systems, the laser is generally operating at or near its maximum composite modulation index. Channel loading also has an effect on laser modulation index. As channel loading increases, the laser composite modulation index increases, and the intermodulation distortion performance degrades.

The laser transmitter is also affected by variations in the headend output RF level due to other factors. The addition or removal of a coupler, tap, or other equipment in the headend wiring scheme can cause changes in the resultant headend RF output level. The headend RF output level also varies slightly with time, temperature, regular maintanance, and adjustments.

These variations in the signals modulating the laser degrade the quality of the transmitted signal, reducing the ability to delivery high quality signals such as video signals in fiber optic communications systems.

At the receiver, the quality of the received optical signal is affected by the fiber plant and the optical transmitter. The number and quality of connectors and splices used in field installation may differ from the originally specified plan, resulting in a different optical loss. If an OTDR measurement used to determine optical is inaccurate, then again the optical power will differ from that expected. The average intensity of the received optical signal may change due to maintanance or repair of the fiber plant. Re-routing an optical path will also affect the optical link loss. As discussed above, several aspects of the transmitter design and RF signal source can also affect the optical signal. The composite modulation index may change as a result of the addition or deletion of channels, variations of signal level, or other changes to the laser drive signal. Additionally, the laser diode output power may vary due to aging or temperature variation.

Receiver performance as measured by carrier-to-noise ratio (CNR) and distortions, composite triple beat (CTB) and composite second order (CSO) is generally degraded by non-ideal optical signals. As the optical input power or modulation index increases, the CNR performance of the receiver generally increases, but the contribution of the receiver to the system distortion increases. Conversely, as the optical input power or modulation index decreases, the contribution of the receiver to system distortion decreases, but the CNR performance of the receiver also decreases.

If variations in optical loss occur, the optoelectronic receiver performance may be affected. If the optical loss is greater than expected, the received optical power is lower than expected. Lower than expected received optical power results in a reduced RF output from the photodetector and optoelectronic receiver. Consequently, the input level to the receiver post-amplifier is lower. This condition increases the significance of the noise contribution of the receiver post-amplifier to the system CNR. The final result may be a degradation in system CNR. If the optical loss is less than expected, the received optical power is higher than expected. This results in an increased RF output level from the photodetector and optoelectronic receiver and generally improves the system CNR. However, with the optoelectronic receiver operating at a higher output level, its contribution to the system distortion is greater. The post-amplifier is also operating at a higher level and may contribute further to the system distortion. Consequently, there may be a degradation in system distortion performance.

Again, these factors limit the ability to deliver high quality signals such as video signal in a fiber optic communications systems.

SUMMARY OF THE INVENTION

Accordingly, it is an object of the present invention to provide methods and apparatus for delivering high quality signals in a fiber optic communication system.

It is another object of the present invention to provide an improved transmitter for a fiber optics communications system.

It is another object of the present invention to provide an improved receiver for a fiber optics communications system.

The present invention achieves these and other objects by providing a system approach to signal level control in AM fiber systems. This set of level controls operates at both transmitter and receiver ends of the fiber transmission system, utilizing different compensation and control techniques at each end to maintain and optimize the performance of the system. Since optical fiber loss characteristics do not change as much as the loss characteristics of coaxial cable, taps, and passives with variations in temperature, the level control system of the present invention compensates for other parameters such as system input and output level variations due to changes in optical loss, system input signal levels, and physical placement of components within the system architecture.

To achieve these objects, the present invention employs, inter alia, a composite RF envelope power detector as the sensing element at the transmitter and a single channel RF carrier peak detector as the sensing element at the receiver. This permits control of the overall input RF modulation envelope used to modulate a linear laser source in the transmitter, and maintains a constant RF lever per carrier in the detected RF modulation envelope at the output of the receiver.

The present invention utilizes gain control circuitry to compensate for variations in signal level. At the transmitter, the composite RF power modulating the laser is monitored and the level of the entire spectrum of channels is adjusted by the same amount to maintain a constant composite power. A composite power AGC for an AM laser transmitter maintains a constant laser modulation index with headend RF level variations and changes in channel loading. Therefore, optimum transmitter distortion performance is preserved. In addition, the composite power AGC can be used to guard against an RF overdrive condition. If the level from one modulator increases by a large amount, the composite power AGC detects the input composite and adjusts the RF level modulating the laser.

Also in accordance with the present invention, gain control circuitry is incorporated into the receiver to compensate for variations in optical loss, modulation index, and channel loading. At the receiver, a single pilot channel is monitored to maintain a constant RF channel level at the output of the optoelectronic receiver. Gain control circuitry controls the gain at the receiver on the basis of changes in the signal level of the pilot channel. This technique maintains a constant RF channel output level and a constant contribution to system CNR by the receiver amplifier and post-amplifier. The RF channel output level of the receiver remains constant with variations in received optical power, modulation index, and channel loading.

In addition to providing an improved transmitter and receiver, the present invention also relates to system wide level control. A pilot channel type AGC can result in distortion changes of the receiver amplifier with variations in channel loading. Thus, if the channel loading increases, distortion due to the receiver amplifier increases and system distortion may increase. However, in accordance with one feature of the present invention when a transmitter with composite power AGC is utilized in combination with a receiver having a pilot channel type AGC, distortion remains unchanged. This combination results in consistent system distortion, good system CNR, and constant system RF output level.

Additionally, in a multiple band system, the present invention maintains a consistent RF channel level between bands. This is important when the bands are combined to produce a single RF signal. Thus, increased channel loading in one band, for example, will not result in RF channel level differences between that band and another band having less channel loading.

BRIEF DESCRIPTION OF THE DRAWINGS

The foregoing and other objects, features and advantages of the present invention as well as a presently preferred embodiment thereof will become more apparent from a reading of the following description in connection with the accompanying drawings.

DETAILED DESCRIPTION OF THE PREFERRED EMBODIMENTS

Figure 1:
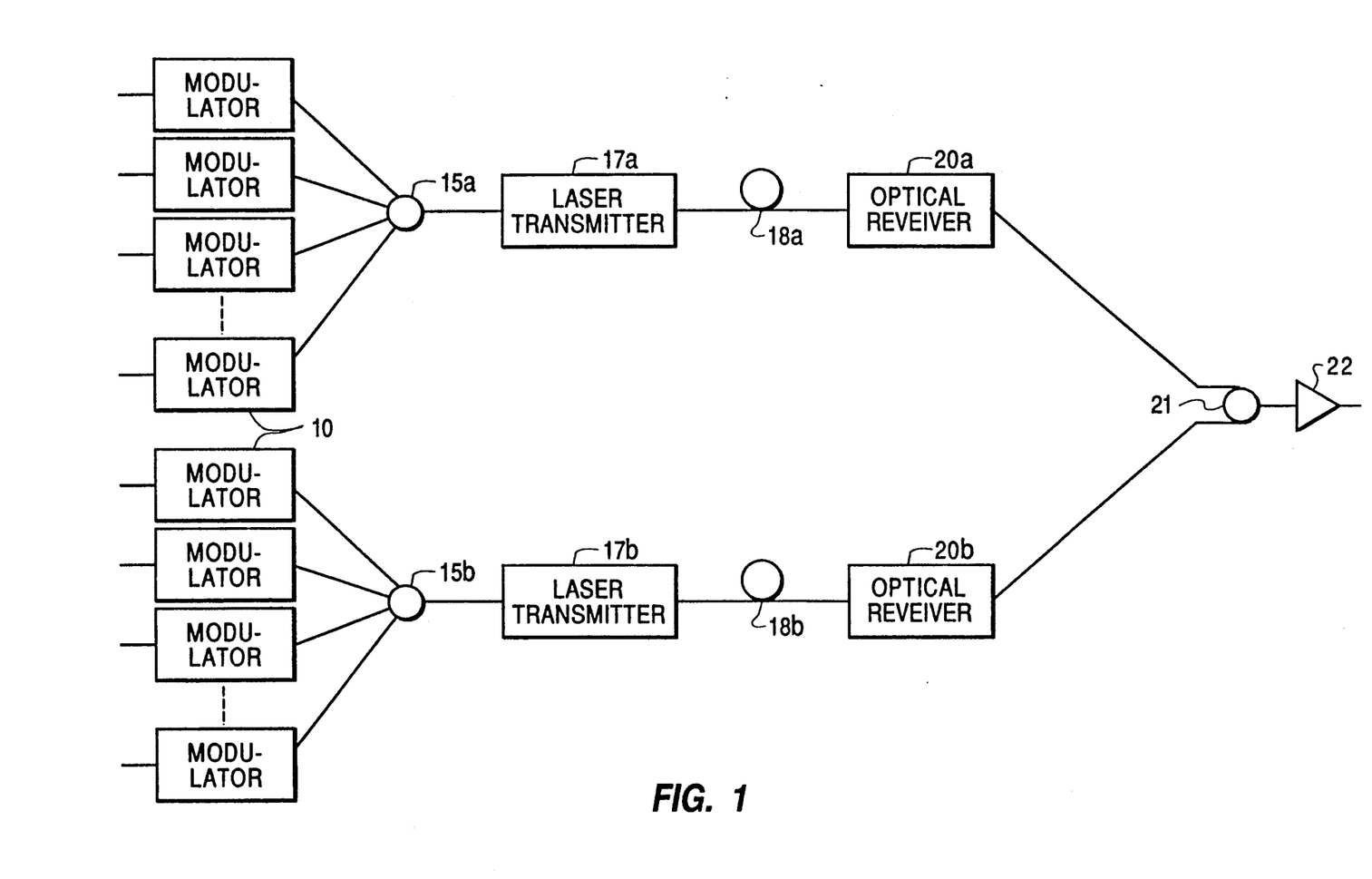
FIG. 1 is a block diagram of a fiber communications system.

FIG. 1 illustrates a fiber communications system. In a currently preferred embodiment, the system is a CATV AM fiber system, although the invention is not limited in this respect. Individual frequency channels from multiple headend modulators 10 feed combining networks 15a and 15b. Combining networks 15a and 15b gather the channels into bands of frequencies to be transported by the distribution plant. These bands of channels provide a modulation input to laser transmitters 17a and 17b. For example, transmitter 17a may receive an RF input in a frequency band from 50-276 MHz and transmitter 17b may receive an RF input in a frequency band from 276-450 or 550 MHz AM laser transmitters 17a and 17b condition the composite headend signals to provide a signal which modulates the bias current of a semiconductor laser. This results in an intensity (power) modulated optical signal out of the laser. The optical signal is carried by low loss, single mode optical fibers 18a and 18b to optical receivers 20a and 20b. Optical receivers 20a and 20b include a photodetector which converts the optical signals into electrical signal currents. The electrical signals are replicas of the headend composite channel bands. The signals are combined by combiner 21, amplified by amplifier 22, and fed to a distribution plant.

Figure 2:
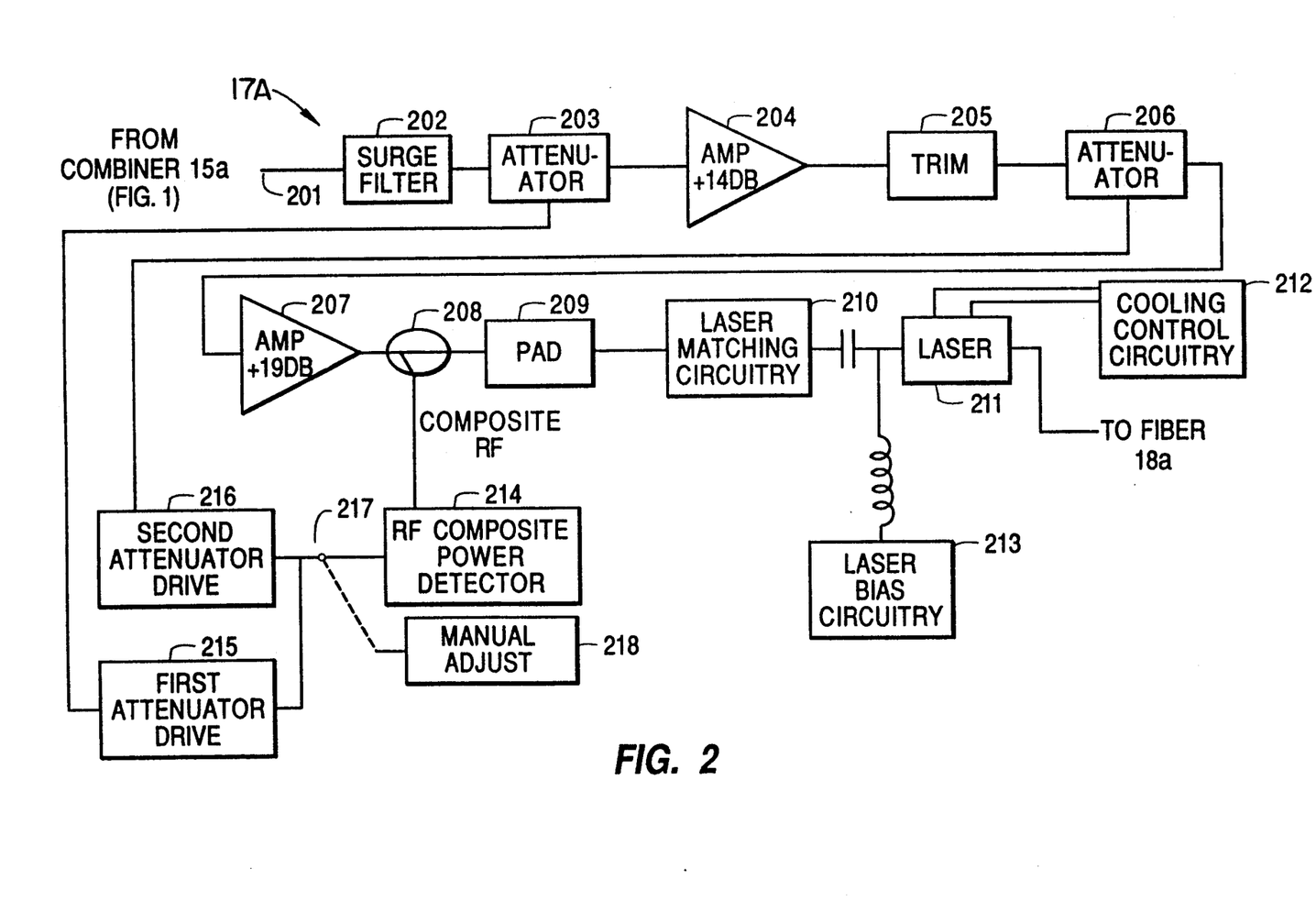
FIG. 2 is a block diagram of a transmitter in accordance with the present invention.

FIG. 2 is a block diagram of transmitter 17a in accordance with a preferred embodiment of the present invention. An RF signal from combiner 15a is input to transmitter 17a at 201. The signal passes to surge filter 202. Surge filter 202 is a high pass filter designed to filter out lower frequency signals and noise, for example, below forty megahertz (40 Mhz). Such signals and noise may be due, for example, the lightning or other electrical interference. The signal then passes to first attenuator 203. Attenuator 203 is preferably a pin attenuator designed to provide up to approximately 5 dB of attenuation, although the invention is not limited in this respect.

The output of attenuator 203 is supplied to first hybrid amplifier 204 which provides an amplification of, for example, 14 dB. The output of hybrid amplifier 204 is supplied to frequency response trim circuitry 205 which trims or smoothes out the frequency response of the signal. The output of trim circuitry 205 is supplied to second attenuator 206. Attenuator 206 is preferably a pin attenuator configured in the same manner as attenuator 203, although this is not required. Attenuator 206 provides up to approximately 5 dB of attenuation, although the invention is not limited in this respect. The output of attenuator 206 is supplied to second hybrid amplifier 207 which provides, for example, an amplification of 19 dB. Hybrid amplifier 207 preferably has better distortion characteristics than hybrid amplifier 204 since the signal level at this point in the transmitter is significantly higher.

The output of hybrid amplifier 207 is supplied to directional coupler 208. The coupled signal of directional coupler 208 is supplied to RF composite power detector 214. The detected composite RF signal is used to generate a gain control signal which is supplied to first attenuator drive circuit 215 and second attenuator drive circuit 216. The output signals of these drive circuits respectively control first attenuator 203 and second attenuator 206. In accordance with the detected composite RF level, the attenuation of attenuators 203 and 206 is varied as needed to maintain the through signal of directional coupler 208 at a constant level. When switch 217 contacts manual adjust 218, first and second attenuator drives 215 and 216 may be manually controlled, for example, by setting a potentiometer.

The through signal of directional coupler 208 is provided to pad 209 for adjusting the signal level into laser 211. The gain control circuitry ensures that the signal level into pad 209 is constant and pad 209 adjusts this level. The signal from pad 209 is provided to laser matching circuitry 210. Matching circuitry 210 matches the 75 ohm coaxial system to lower the laser impedance. The output of laser matching circuitry 210 modulates laser 211. Laser 211 is a high-performance analog laser, preferably of the distributed feedback (DFB) type, with an integral optical isolator, thermoelectric cooler monitor photodiode, and thermistor. To maintain a proper output power level, the temperature of the laser is controlled by cooling circuitry 212. Laser bias circuitry 213 is used to adjust the laser bias current.

Figure 3:
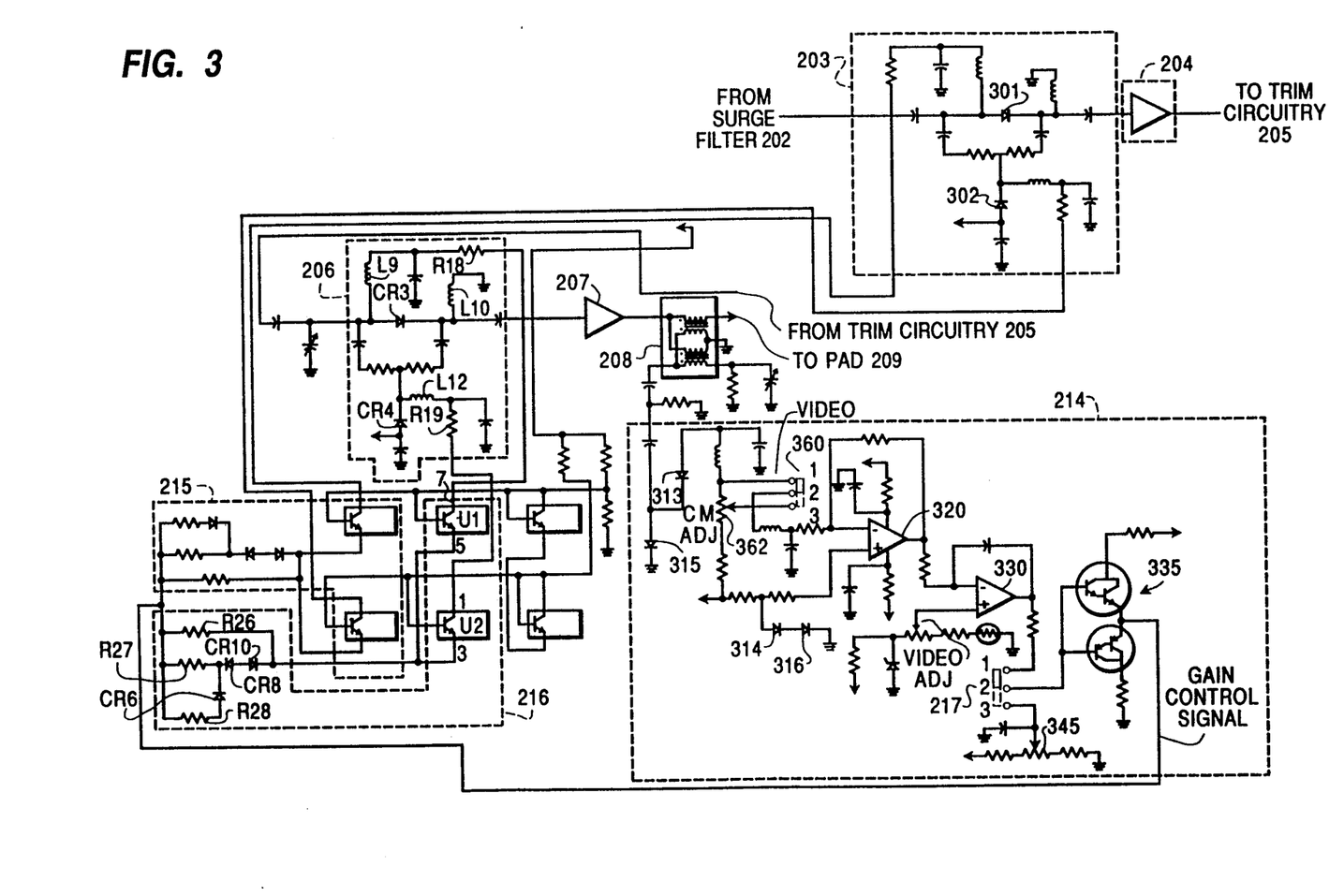
FIG. 3 is a schematic diagram of the gain control circuitry of the transmitter of FIG. 2.

FIG. 3 is a schematic diagram of the gain control circuitry of the transmitter of FIG. 2. Attenuator 203 is a pin attenuator. The pin attenuator is a bridged T-network. As the currents in pin diodes 301 and 302 are varied, the attenuation of the pin attenuator changes. The pin attenuator is designed to provide approximately 5 dB of attenuation. The currents through pin diodes 301 and 302 vary in opposite directions in order to maintain a seventy-five (75) ohm impedance. Although a bridged T-network is shown in FIG. 3, other arrangements may be utilized. Attenuator 206 is preferably a pin attenuator configured in the same manner as attenuator 203.

The coupled signal of directional coupler 208 is provided to RF detector diodes 313 and 315. Two diodes are utilized to reduce CSO caused by the diodes themselves. The detected composite RF singal is supplied to comparator 320 where it is compared with a temperature compensated DC reference to determine whether the composite RF level has gone up or down. Diodes 314 and 316 are matched with diodes 313 and 315 to provide temperature compensation. The output of comparator 320 is provided to integrator 330. The integrated output of integrator 330 is amplified at amplification stage 335 to provide a gain control signal for determining the current to be driven through the pin diodes of attenuators 203 and 206.

The AGC driver circuits include respective current mirrors responsive to the gain control signal for driving current through the pin diodes. In pin attenuator 206, current flow is from +24 Volts, through CR4, L12, R19, U2(1), U2(3), U1(5), U1(7), R18, L9, CR3, L10, to ground. The gain control signal changes the magnitude of this current in accordance with changes in the detected signal level.

Linearization networks prior to the current mirrors ensure a linear attenuation in dB versus the voltage of the gain control signal. That is, as the voltage of the gain control signal changes in a certain step, the attenuation changes in a corresponding scaled step. A linearization network is provided for each of the pin attenuators. The linearization network for pin attenuator 206 includes resistors R26, R27, and R28 and diodes CR6, CR8, and CR10.

Switch 217 permits either automatic gain control or manual control to be implemented. If switch 217 contacts poles 2 and 3, gain control is implemented automatically as described above. If the switch contacts poles 1 and 2, the manual adjustment of potentiometer 345 determines the gain control signal.

Switch 360 takes into account the higher power of continuous wave (CW) signals used for system testing as compared to video signals used in actual field implementation. By switching switch 360 to the CW position, the setting of potentiometer 362 effectively reduces the power of the composite CW signal applied to comparator 320. Were the AGC set at the factory in accordance with the composite CW power, the normal video signals in actual field use would be regarded by the AGC circuitry as a loss in power, thereby causing a reduction in attenuation. This reduction effectively limits the attenuation range. Setting switch 360 to the CW position during testing allows for the full range of attenuation during actual use with video signals.

The present invention utilizes two stages of attenuation. This allows for increased attenuation range. Additionally, it is desirable not to have large attenuation before the first gain stage since this may adversely affect carrier-to-noise ratio. However, if some attenuation is introduced before and after the first gain stage, the carrier-to-noise remains acceptable. Additionally, operating the first gain stage at a lower signal level reduces the distortion caused by this stage. Since the laser is the primary cause of distortion in the transmitter, it is very desirable to limit the introduction of distortion at earlier stages.

As noted, the transmitter implements composite power gain control. Thus, the composite RF power modulating the laser is monitored and the level of the entire spectrum of channels is adjusted by the same amount to maintain a constant composite power. The advantage of composite power AGC for an AM laser transmitter is that it maintains a constant laser modulation index with headend RF level variations and changes in channel loading. Therefore optimum transmitter distortion performance is preserved. In addition, the composite power AGC can be used to guard against an RF overdrive condition. If the level from one modulator increases by a large amount, the composite power AGC detects the increase in transmitter input composite power and adjusts the RF level modulating the laser.

Figure 4:
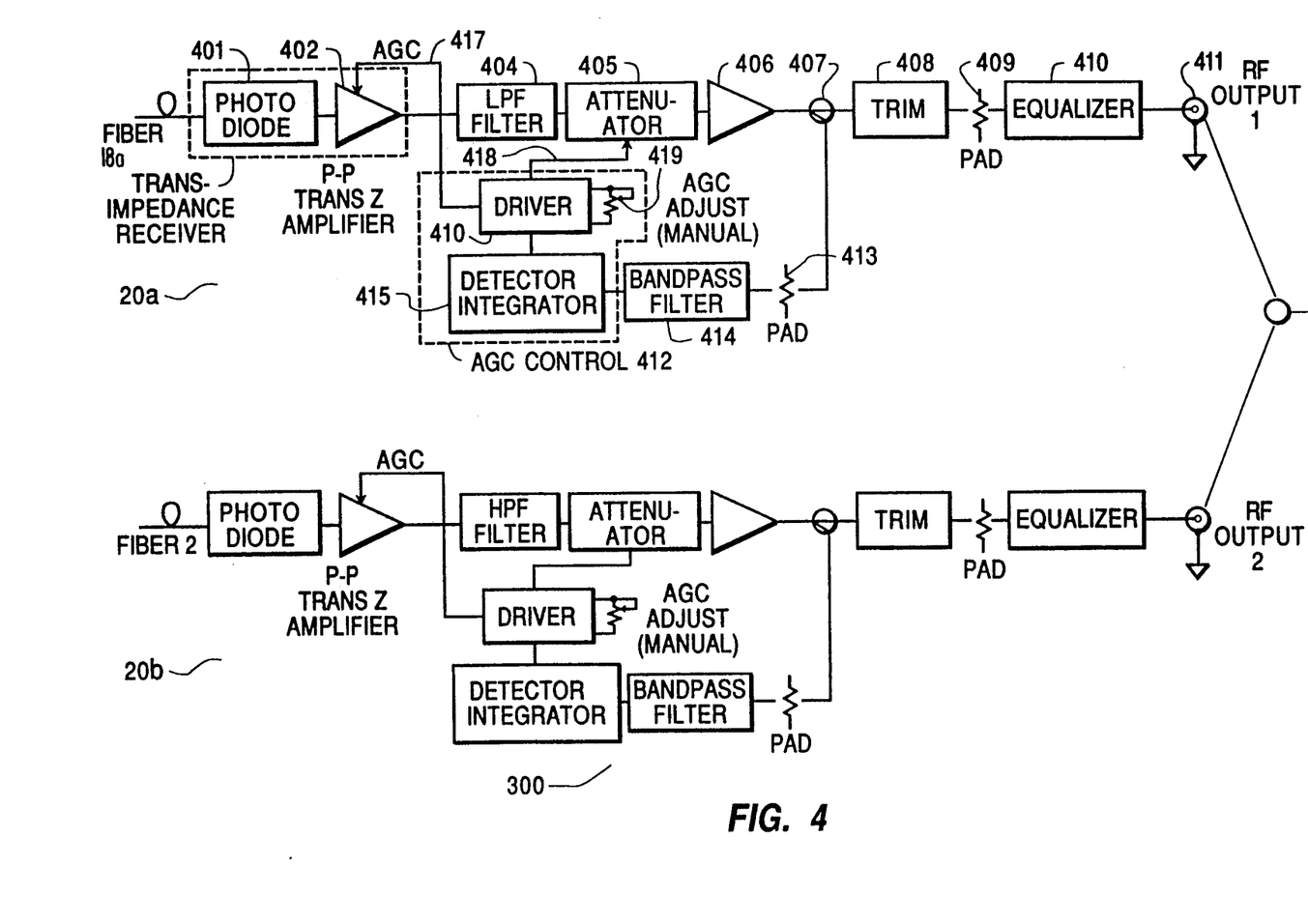
FIG. 4 is a block diagram of a receiver in accordance with the present invention.

FIG. 4 is a block diagram of the receiver modules 20a and 20b of FIG. 1. As noted above, one receiver may receive a low band of channels and the other may receive a higher band of channels. Except as noted, the two receivers are identical and although receiver 20a is discussed in detail, the following description may be applied to both. An optical signal carried by fiber 18a is incident on photodiode 401. The optical signal is transformed by photodiode 401 into an electric current by the photoelectric effect. The electric current is then supplied to a push-pull transimpedance amplifier 402 which converts it to an amplified RF signal. The RF signal at the output of the push-pull transimpedance amplifier 402 consists of a broadband spectrum of video signals. Transimpedance amplifier 402 includes a gain circuit that maintains a specified RF output level as determined by an automatic gain control (AGC) circuit. Photodiode 401 and transimpedance amplifier 402 together constitute a transimpedance receiver. The transimpedance receiver and automatic gain control will be discussed in greater detail below.

The output of transimpedance amplifier 402 then passes to an input of low pass filter 404. Filter 404 is used in multiple band systems in order to maintain high system performance. The filter type and cutoff frequency are determined by system requirements. Conversely, the filter in the high band receiver 20b is a high pass filter. Filter 404 may be included or a jumper may be provided in single band systems.

The signal at the output of filter 404 is supplied to attenuator 405. Attenuator 405 is a variable attenuation block such as a pin attenuator. The attenuation of attenuator 405 is controlled by the AGC circuit as will be discussed in greater detail below. Assuming an insertion loss of about 2 to 3 dB, attenuator 405 provides from minimum attenuation up to approximately 6 to 10 dB of additional attenuation.

After the signal passes through attenuator 405, it is supplied to hybrid amplifier 406. Hybrid amplifier 406 provides the grain needed to obtain a desired module output level. The output of hybrid amplifier 406 is supplied to directional coupler 407. The through signal of directional coupler 407 is passed to trim network 408. Trim network 408 is an RF network to level out the response of the module. Variations in response may be caused by transimpedance amplifier 402, attenuator 405, and stray capacitances. Trim network 408, for example, "peaks up" carriers that are rolled off at the edge of the passband of filter 404. Trim network 408 may not be needed in single band systems since, as noted above, filters need not be used in such systems. The output of trim network 408 passes to pad 409. Pad 409 provides the ability to manually adjust the RF output level from the receiver module. Pad 409 enables the output of the high channel and low channel receiver to be matched. The signal from pad 409 passes to equalizer 410. Equalizer 410 compensates for a tilt or flat slope of the RF signal and/or provides a desired tilt at the output 411 of the receiver module.

The coupled RF signal of directional coupler 407 is monitored by the AGC circuitry 412. AGC circuitry 412 includes detector and integrator 415, and driver circuitry 416.

The portion of the RF signal that is monitored by the AGC circuitry 412 first passes to pad 413. Pad 413 permits adjustment of the level of the RF signal supplied to detector and integrator 415. The RF signal is passed through band pass filter 414. Bandpass filter 414 is a single channel, helical filter approximately six (6) to ten (10) Megahertz wide. Bandpass filter 414 passes only one channel of the RF signal and the passband center frequency of filter 414 is selected so a desired pilot channel is passed. The RF level of all channels are thus adjusted up or down based on the level of the pilot channel. The pilot channel RF signal is applied to the input of detector 415. Detector 415 converts the pilot channel RF signal to a DC voltage and compares the DC voltage to a reference voltage. This comparison determines the relative RF level in the module. A DC signal proportional to the RF level in the module is fed to AGC driver circuit 416.

AGC driver circuit 416 outputs signal 417 to adjust the gain in push-pull transimpedance amplifier 402 and signal 418 to adjust the attenuation of attenuator 405 as necessary to obtain a desired module RF output level. Thus, the level control of the present receiver is implemented in two stages, although the invention is not limited in this respect. The first stage is the gain control stage in the push-pull transimpedance receiver. The purpose of this stage is to maintain a specified minimum output level from the transimpedance receiver. It is desirable to maintain a specified minimum output level from the transimpedance receiver in order to obtain a high system carrier-to-noise ratio. The first stage provides about a 6 dB range of gain control. The second gain control stage in the AGC system is attenuator 405. This second stage maintains a constant output level and provides additional range for the AGC system. In a preferred embodiment, there is approximately 8 dB of attenuation control in attenuator 405. A switch may be used to switch to manual mode. In manual mode, potentiometer 419 is set to control the gain.

A single carrier pilot type AGC maintains a constant RF channel level at the output of the receiver. The primary advantages of this technique are a constant RF output level and a constant contribution to system CNR by the receiver amplifier and post-amplifier. The RF channel output level of the receiver remains constant with variations in received optical power, modulation index and channel loading.

Figure 5:
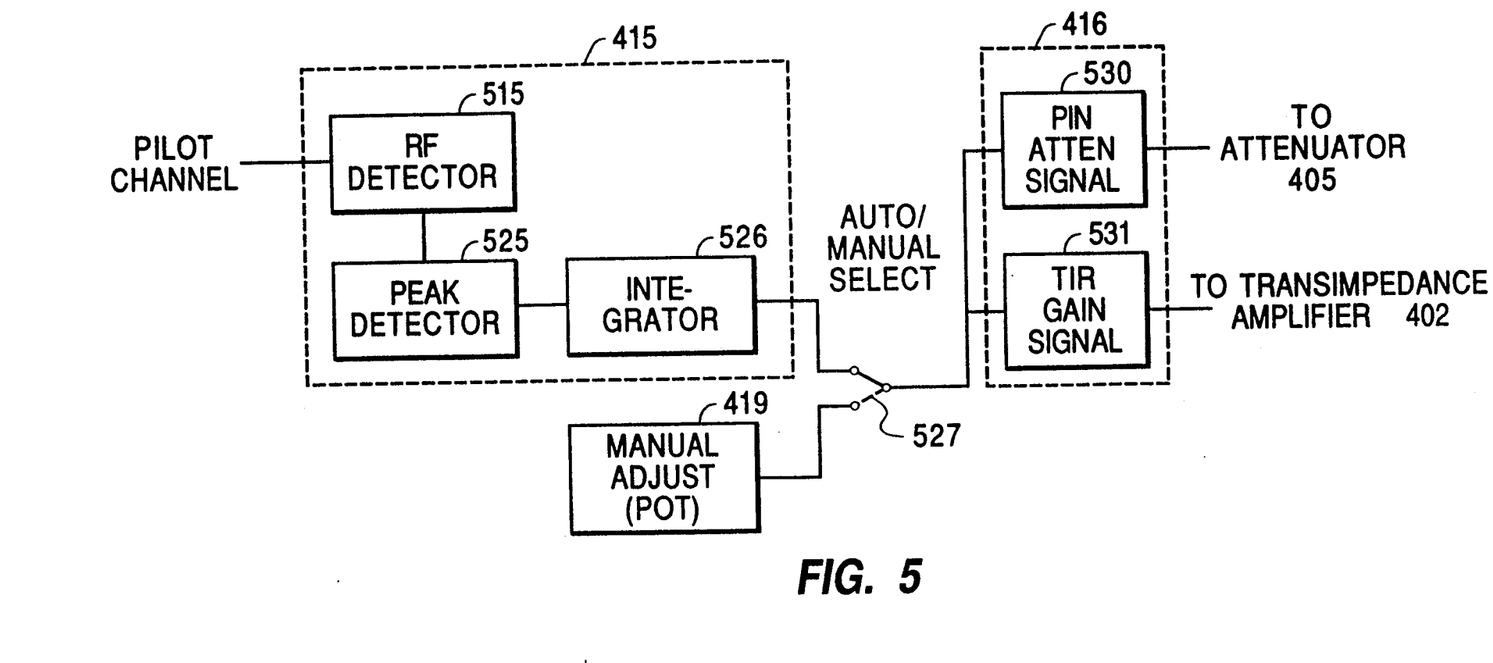
FIG. 5 is a block diagram of the AGC control for the receiver of FIG. 4.

FIG. 5 is a block diagram of AGC control 412 for the receiver of FIG. 4. The pilot channel from filter 414 (FIG. 4) is supplied to RF detector 515. RF detector 515 provides a signal that is proportional to the envelope of the detected RF signal. The signal passes to peak detector 525. Peak detector 525 converts the envelope signal to a constant DC signal whose amplitude is proportional to the peak of the envelope signal. After peak detector 525, the signal passes to integrator 526. Integrator 526 effectively slows down the response time of the AGC circuit so that the signal level at the output of the receiver does not vary rapidly. The signal then goes through the auto/manual select switch 527. When the switch is in the auto position, the output of integrator 526 provides a control signal for automatic gain control operation. When the switch is in the manual position, a DC voltage provided by a manually adjusted potentiometer 419 sets the gain. The DC signal from the auto/manual select switch is the gain control signal. The gain control signal is input to attenuator drive circuit 530 and transimpedance receiver gain drive circuit 531.

Figure 6:
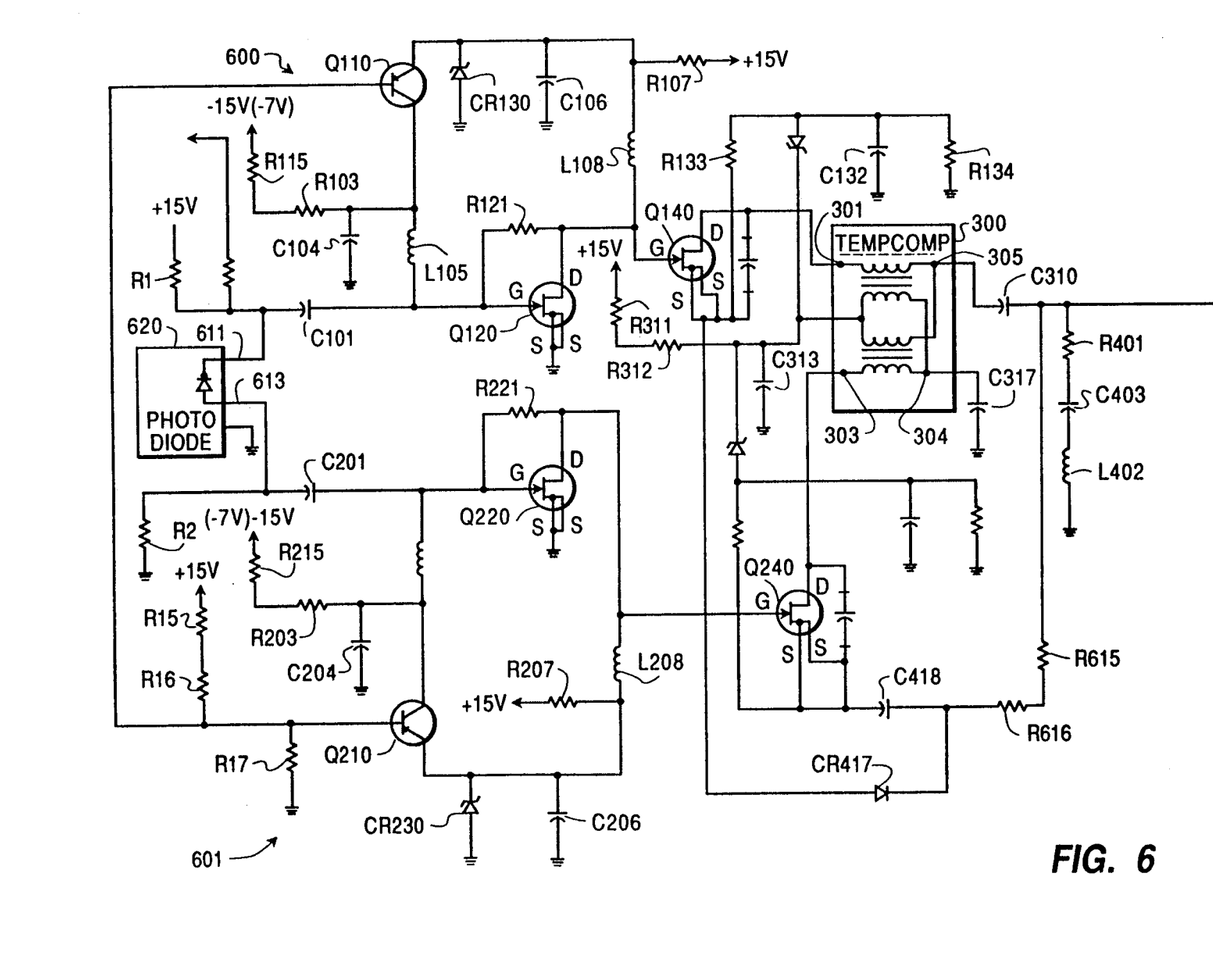
FIG. 6 is a schematic diagram of a transimpedance receiver used in the present invention.

FIG. 6 is a schematic diagram of a transimpedance receiver used with the present invention. Referring to the Figure, a photodetector, which is preferably a photodiode 620, receives an optical input signal transmitted to it by optical fiber 18a (see FIG. 1). Cathode terminal 611 of the photodiode 620 is connected through resistor R1 to a DC voltage which in the preferred embodiment is +15 Volts. Anode terminal 613 of the photodiode 620 is connected through a resistor R2 to ground. Terminal 611 of photodiode 620 feeds first transimpedance amplifier 600 through capacitor C101. Similarly, the other terminal 613 of photodiode 620 feeds second transimpedance amplifier 601 through blocking capacitor C201. Both of these transimpedance amplifiers 600 and 601 are configured identically, and the following description of the transimpedance amplifier 600 also applies to the transimpedance amplifier 601. In this regard it will be noted that the tens and units digits of the identification number of each component in amplifier 600 are identical to the tens and units digits of the identification numbers in corresponding components of the amplifier 601.

Transimpedance amplifier 600 is built around field effect transistor Q120, the source ("S") terminals of which are connected to ground. A feedback path is provided between the drain ("D") terminal of field effect transistor Q120 by feedback resistor R121.

The gate of field effect transistor Q120 is connected to the incoming RF signal passing through blocking capacitor C101. The DC voltage which is applied to the gate of field effect transistor Q120 is effectively controlled by a bias regulating circuit built around transistor Q110. The base of transistor Q110 is connected to ground through resistor R17 and to the +15 volt power supply through resistors R16 and R15. R15, 16 and 17 are selected to provide an input bias reference voltage to the base of transistor Q110 of approximately +3 volts. The collector of transistor Q110 is connected to ground through blocking capacitor C104 and to a −15 volt DC supply through resistors R103 and R115. The collector of transistor Q110 is also connected to the gate of field effect transistor Q120 through inductor L105. The emitter of Q110 is connected to the +15 volt DC power through resistor R107 and back to the drain of field effect transistor Q120 through an inductor L108 which is essentially an open circuit to radio frequency signals. Paths to ground from the emitter of transistor Q110 are provided by blocking capacitor C106 and a Zener diode CR130 which is normally conductible and functions to limit the source to drain voltage of Q120 during turn ON/OFF during power interruptions. Transistor Q120 is a gallium arsenide field effect transistor (GASFET) with a maximum voltage rating of 5 volts.

In the above circuit, the base to emitter voltage drop across the transistor Q110 is approximately 0.7 volts. Thus, if the transistor is conducting, the voltage at the emitter of transistor Q110 will be approximately +3.7 volts.

In the above circuit, the inductor L108 is constructed to behave as short circuit to DC signals and as a pure resistive component to AC signals at the radio frequencies in question (i.e., over 50 Mhz). Preferably, L108 will appear to be a resistive impedance of approximately 600 to 700 ohms at frequencies in the 50 Mhz to 550 Mhz range. The inductor L108 may be formed of five turns of #30 enamel wire.

The drain terminal of field effect transistor Q120 is connected to terminal 301 at the primary winding of output transformer 300 via a high impedance buffer amplifier stage. This buffer amplifier stage includes a transistor Q140 whose sources are connected to ground through resistor R133 and resistor R134. A radio frequency path to ground is provided from a point in the circuit between resistor R133 and R134 by blocking capacitor C132. The drain of transistor Q140 is connected to terminal 301 at the primary winding of the output transformer 300 and the gate of transistor Q140 is connected to the drain terminal of field effect transistor Q120.

The output transformer 300 is a ferrite core transformer which is similar to the type commonly used for broadband amplifier applications. The terminal 303 at the primary winding of the output transformer is connected to the output of the other transimpedance amplifier 501. The center tap terminal 302 at the primary winding is connected to the +15 volt power supply through resistors R312 and R311 and to ground through blocking capacitor C313. The transformer 300 preferably has a 2 to 1 turns ratio or a 4 to 1 impedance ratio. The transformer 300 acts to transform the unbalanced load impedance at its output terminals 305 and 304 to a balanced load for the drains of transistors Q140 and Q240. The circuitry connected to the center tap terminal 302 of the primary winding of the transformer provides an AC short to ground at that point and also a path for the DC bias voltage to the drain of transistor Q140.

Blocking capacitor C317 provides a path from terminal 304 to ground for RF signals, and blocking capacitor C310 provides a path for the radio frequency signal to the output terminals of the receiver. The output of the receiver may, optionally, be connected to equalization network 400 comprising resistor 401 connected in series to comparator C403 which in turn is connected through resonating inductor L402 to ground. The equalization network 400 is utilized to correct for out any nonlinearities in the response of the receiver caused by imperfections in the remainder of the circuitry.

With feedback resistor R121 of transimpedance FET Q120 fixed, for a given optical signal incident on photodiode 520, a given RF level is provided by FET Q120. If the optical input level changes, the RF output level will change correspondingly. After the buffer amplifier, gain control is performed.

The transimpedance receiver of the present invention also includes automatic gain control circuitry. A DC control voltage is input on the RF output line. In the present receiver, the DC control voltage is the output of TIR gain drive 531 (FIG. 5). Capacitor C310 prevents the DC voltage from affecting the RF output transistors Q140 and Q240. The DC voltage serves to bias pin diode CR417 through resistors R615 and R616. Pin diode CR417 AC couples (due to the presence of capacitor C418) the sources of output FETs Q140 and Q240. When diode CR417 is OFF and offers a high impedance, it has no effect and the transimpedance receiver operates at maximum gain. As diode CR417 turns ON when the DC control voltage increases, diode CR417 appears as a lower impedance and the degeneration in the shunt leg of transistors Q140 and Q240 increases, i.e., the gain of transistors Q140 and Q240 is decreased. The output level may thus be varied by varying the gain of the output transistors Q140 and Q240 through varying the bias of diode CR417 in accordance with the output of TIR gain drive 531.

Figure 7:
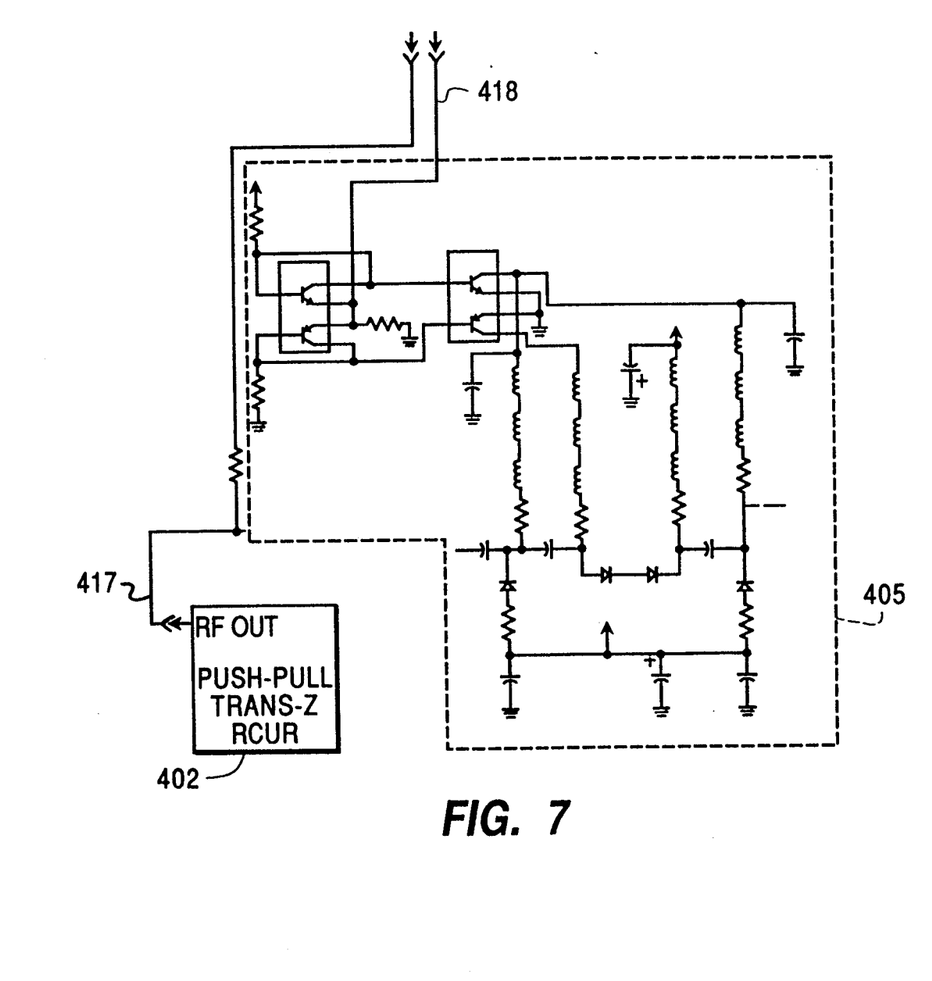
FIG. 7 is a schematic diagram of the attenuator of FIG. 4.

FIG. 7 is a schematic diagram of the attenuator 405 and its associated circuitry. The portions of the schematic diagram corresponding to blocks in the block diagram have been identified using the same reference numbers.

The attenuator control signal 418 from attenuator drive 530 determines the attenuation of attenuator 405 which, as shown in FIG. 7, is a pin attenuator. The resistance of a pin diode is a function of the current passing through it. By appropriately controlling that current, the attenuation can be controlled. That is, by controlling the attenuator control signal 418, the current through the respective pin diodes is varied in opposite directions and the attenuation is changed. This changes the RF level of the signal passing through by pin attenuator 405.

Similarly, control signal 417 controls the gain of the transimpedance receiver. As discussed above, the RF output line of the transimpedance receiver has a DC control signal superimposed thereon for controlling the gain of the amplifier thereof. The relationship of the transimpedance receiver control signal 417 and the pin attenuator control signal 418 will be explained below.

Figure 8:
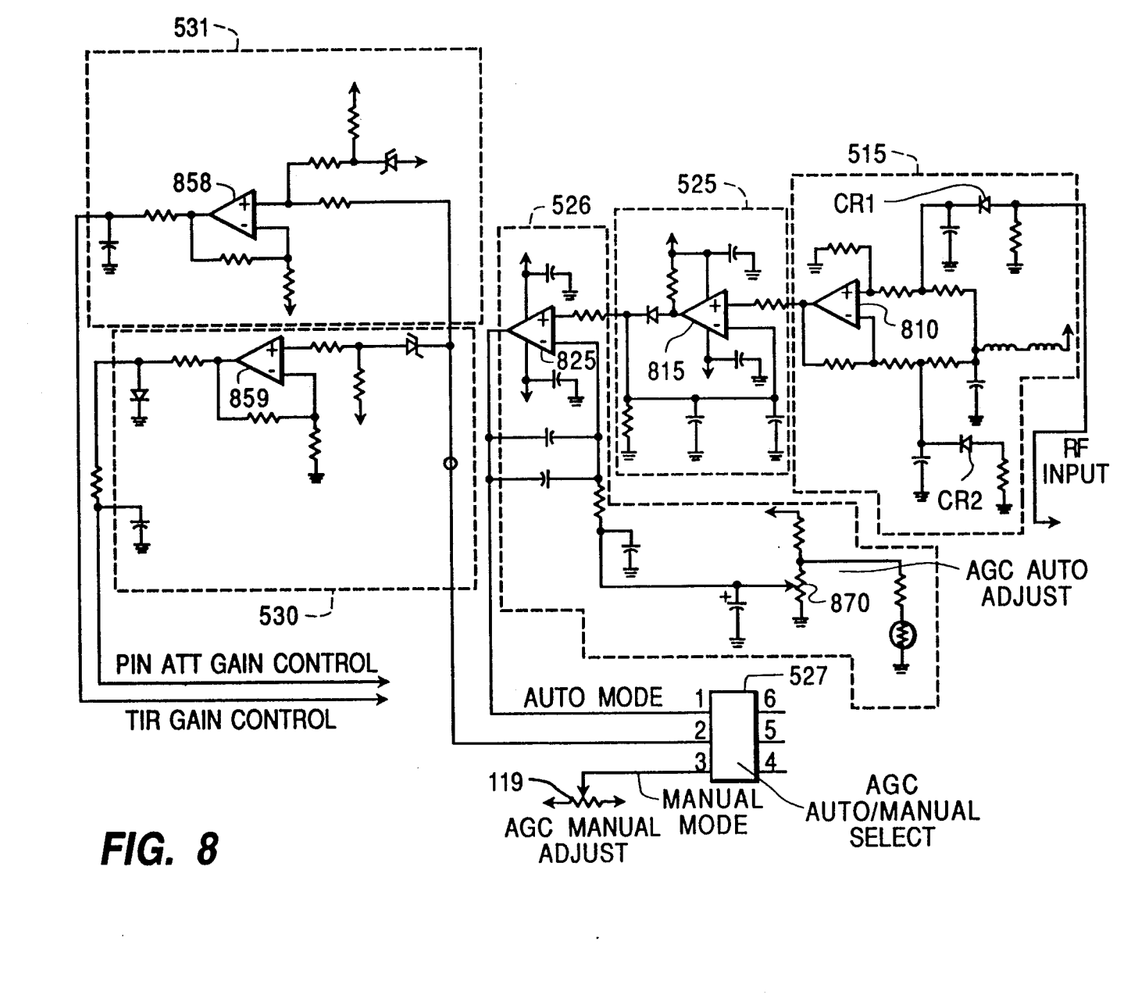
FIG. 8 is a schematic diagram of the AGC control shown in FIG. 5.

FIG. 8 is a schematic diagram of components shown in FIG. 5. With reference to FIG. 8, RF input is supplied as indicated. CR1 is a detector diode. CR2 is a matched diode. The output of the envelope detector has a DC bias on it. The second diode has the same DC bias on it. The first DC bias is subtracted from the second DC bias to compensate for drifts due to temperature, aging, etc. The RF envelope is provided at the output of op amp 810. Op amp 815 is part of peak detector 525. The RF envelope is a function of the RF modulation, i.e., the picture. A horizontal sync pulse is followed by picture information. Op amp 815 is used to determine the maximum level, i.e., the level of the horizontal sync pulse. The peak detector will slowly follow any drift in maximum signal level. The output of op amp 815 is supplied to op amp 825 of integrator 526. A fixed voltage is supplied to one input and the voltage on the other input is output of peak detector 525. The output of integrator 526 is the integral of the difference between these signals. This output is known as the error voltage and is measure of the difference between the two input signals.

This error signal is the signal which eventually adjusts all the AGC control lines. By varying the auto adjust potentiometer 870, the DC voltage supplied to the negative input of op amp 825 is made larger or smaller and thus, the error voltage is made larger or smaller. This generates a larger or smaller voltage signal controlling the transimpedance receiver and the attenuator. That is, given the peak detector output, by varying the potentiometer, the attenuators can be made to sit at different levels. This permits calibration of the RF output at a given time at some given level. For example, if the RF input is 17 dBmv, the gain of the transimpedance receiver may be at 6 dB and the attenuator of the attenuation at 0 dB.

The error voltage goes to the auto/manual switch 527. The switch selects whether gain control will be based on the error voltage or on the voltage as determined by the manual mode potentiometer 419.

In the present embodiment, the operating range for linear control of the diode circuits of the transimpedance amplifier and the pin attenuator is between −5 volts and +5 volts. That is, when the error voltage or the voltage determined by potentiometer 896 (hereinafter "control signal") is between −5 volts, the gain of the transimpedance receiver and the attenuator of the attenuation are controlled. Outside of this range, an indicator such as an alarm may be provided to an operator.

The output of op amp 858 is supplied to the TIR gain control and the output of op amp 859 goes to the pin attenuator control. These are the actual drive voltages for those attenuators. When the control signal to the inputs of these op amps is between about −5 volts and about 0 volts, the output of op amp 858 will vary and control the gain of the transimpedance receiver accordingly. The output of op amp 859 when the control signal is in the range between −5 and 0 remains constant at a voltage at which the pin attenuator has minimum attenuation. As the control signal varies from 0 to +5 volts, the output of op amp 859 changes to vary the attenuation of the attenuator from minimum to maximum attenuation. In this range, the output of op amp 858 remains constant and the gain of the transimpedance receiver remains at a minimum.

Figure 9:
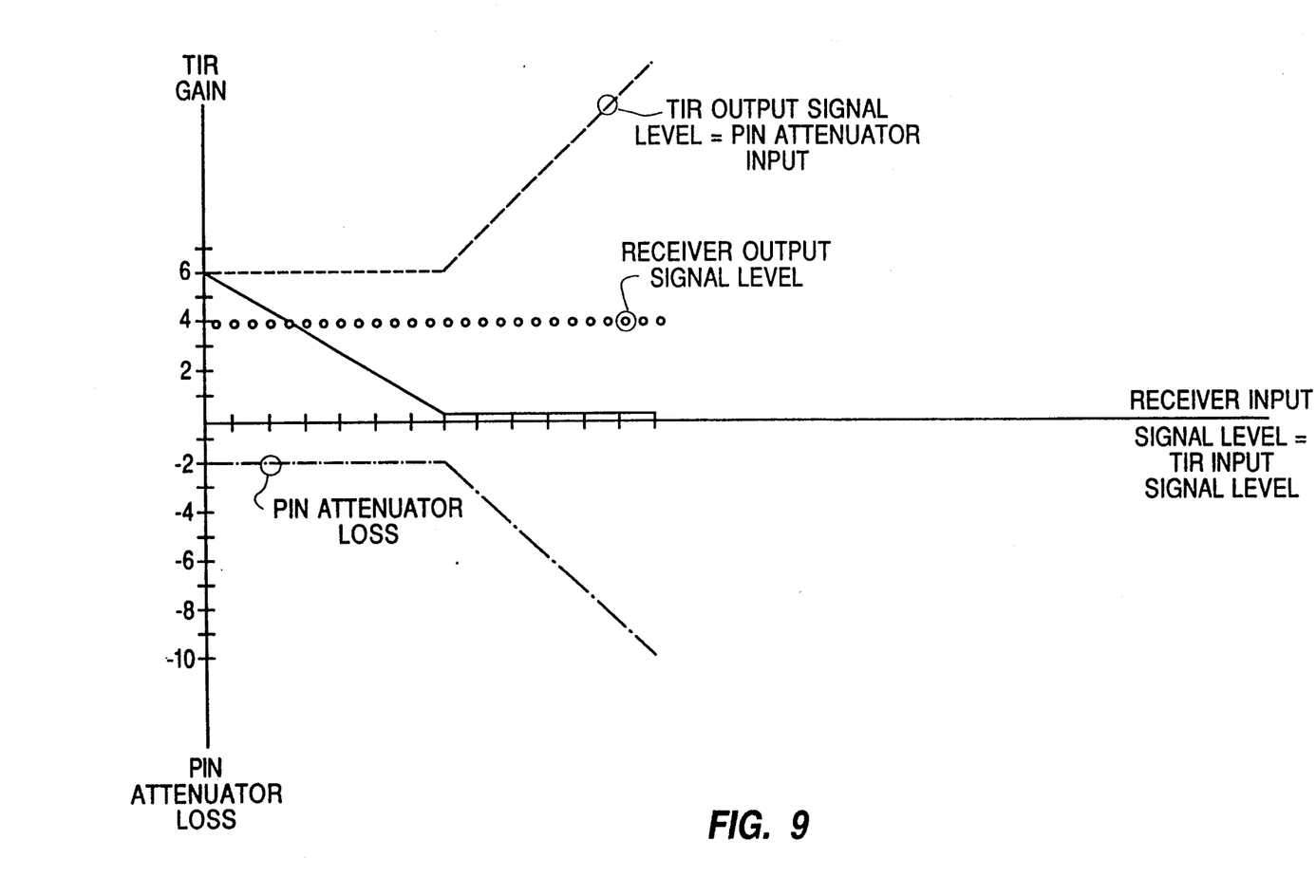
FIG. 9 is a graph illustrating a relationship of receiver input signal level versus transimpedance receiver gain and attenuator loss.

FIG. 9 graphically illustrates the implementation of gain control in accordance with the present invention. The Figure illustrates a graph of the receiver input signal level versus the transimpedance receiver gain and pin attenuator loss. As shown by the solid line, as the receiver input signal level is initially increased from some initial value, the gain of the transimpedance receiver is decreased. This maintains a constant output signal level from the transimpedance receiver as shown by the dashed line and also maintains a constant output signal level from the receiver module. It can be seen with reference to the dot-dash line that during this initial increase, the pin attenuator loss remains constant at its minimum value.

When the gain of the transimpedance receiver has been controlled to its minimum value, further increases in the receiver input signal level will result in an increase in the signal level output of the transimpedance receiver as shown by the dashed line. However, at this point the pin attenuator begins to attenuate as shown by the dot-dash line. This acts to maintain a constant receiver output signal level as shown by the dotted line, even though the output of the transimpedance receiver is increasing. Accordingly, the receiver output signal level remains constant over a wide range of input signal levels.

A further feature of the present invention is a fiber system in which a composite power type AGC is implemented in a transmitter and a pilot channel type AGC is implemented in a receiver. The importance of headend signal level maintenance on the performance of a fiber system, including the AM fiber link, is critical and stability can be augmented by the use of a composite power sensing AGC in the transmitter. In a receiver, signal levels can best be stabilized versus optical loss variation, channel loading variations, and equipment changes by the use of a pilot carrier AGC. A pilot carrier type AGC can result in increased system distortion if channel loading increases. However, when using a transmitter with composite power AGC distortion remains unchanged. Thus, a system operator has great flexibility in adding channels without degrading system performance.

The use of pilot carrier AGC in the receiver offers additional benefits in multiple band systems such as that illustrated in FIG. 1. This AGC approach maintains consistent RF channel level between bands. Thus, changes in the number of channels carried by the bands do not affect the channel levels in the different bands.

Although the present invention has been described in connection with preferred embodiments, it will be apparent that numerous adoptions and modifications may be made thereto without departing from the spirit and scope of the invention, as set forth in the following claims.

We claim:

1. A transmitter for use in a fiber communications system, comprising:
    an input terminal for receiving a composite electrical signal;
    a first level setting circuit for variably setting a level of the composite electrical signal supplied to said input terminal;
    a second level setting circuit for variably setting a level of a composite electrical signal output by said first level setting circuit;
    a laser responsive to a composite electrical signal output by said second level setting circuit for outputting a modulated optical signal corresponding to the composite electrical signal supplied to said input terminal;
    detecting means for detecting the composite electrical signal output by said second level setting circuit and outputting a control signal based on a composite level of the detected electrical signal; and
    adjusting means responsive to the control signal for adjusting said first and second level setting circuits.

2. The transmitter in accordance with claim 1, wherein said first and second level setting circuits comprise attenuation circuits.

3. The tranmsitter in accordance with claim 1, wherein said first and second level setting circuits comprise pin attenuators.

4. The transmitter in accordance with claim 3, wherein said pin attenuators each comprise a bridged T-network.

5. The transmitter in accordance with claim 1, further comprising:
    a first amplifier connected between said first and second level setting circuits for amplifying the composite electrical signal output by said first level setting circuit; and
    a second amplifier connected between said second level setting circuit and said laser for amplifying the composite electrical signal output by said second level setting circuit.

6. The transmitter in accordance with claim 1, wherein said detecting means comprises:
    detector diodes for detecting the composite electrical signal output by said second level setting circuit;
    a comparator for comparing the detected signal received at a first input with a reference signal received at a second input and outputting signals corresponding to changes in a level of the detected signal;
    an integrator for integrating the signals output by said comparator; and
    amplifying means for amplifying the integrated signals to generate the control signal.

7. The transmitter in accordance with claim 1, further comprising:
    means, responsive to a user setting, for generating a user signal supplied to the first input of said comparator to thereby generate a control signal for adjusting said first and second level setting circuits; and
    a switch for selectively providing the user signal or the detected signal to the first input of said comparator.

8. The transmitter in accordance with claim 7, wherein said means responsive to a user setting comprises a potentiometer.

9. The transmitter in accordance with claim 1, wherein said adjusting means comprises a first adjusting circuit responsive to the control signal for adjusting the level set by said first level setting circuit and a second adjusting circuit responsive to the control signal for adjusting the level set by said second level setting circuit.

10. The transmitter in accordance with claim. 1, wherein the received composite electrical signal is a CATV signal.

11. A receiver for use in a fiber communications system, comprising:
    a photodetector for converting a received optical signal to a composite electrical signal;
    a variable gain amplifier for variably amplifying the composite electrical signal output by said photodetector;

a level setting circuit for variably setting a level of a composite electrical signal output by said variable gain amplifier;

an output terminal for outputting a composite electrical signal output by said level setting circuit as an output composite electrical signal corresponding to the received optical signal;

detecting means for detecting the composite electrical signal output by said level sitting circuit and outputting a control signal based on a level of a pilot portion of the detected electrical signal; and adjusting means responsive to the control signal for adjusting said variable gain amplifier and said level setting circuit.

12. The receiver in accordance with claim 11, wherein said variable gain amplifier comprises a variable gain transimpedance amplifier.

13. The receiver in accordance with claim 11, wherein said level setting circuit comprises an attenuation circuit.

14. The receiver in accordance with claim 11, wherein said level setting circuit comprises a pin attenuator.

15. The receiver in accordance with claim 11, wherein said adjusting means comprises a first adjusting circuit for generating a first signal to adjust the gain of said variable gain amplifier and a second adjusting circuit for generating a second signal to adjust the level set by said level setting circuit.

16. The receiver in accordance with claim 15, wherein said first adjusting circuit adjusts the gain of said variable gain amplifier while the level set by said level setting circuit is constant.

17. The receiver in accordance with claim 15, wherein said second adjusting circuit adjusts the level set by said level setting means while the gain of said variable gain amplifier is constant.

18. The receiver in accordance with claim 11, wherein said detecting means comprises:

a filter for filtering the pilot portion from the composite electrical signal output by said level setting circuit.

19. The receiver in accordance with claim 18, wherein said detecting means further comprises:

a detector for generating an envelope signal proportional to the envelope of the pilot portion of the composite electrical signal output by said level setting circuit;

a peak detector for generating an output signal proportional to the peak of the envelope signal;

an integrator for integrating the output signal of said detector to provide the control signal.

20. The receiver in accordance with claim 19, further comprising:

means, responsive to a user setting, for generating a control signal for adjusting said variable gain amplifier and said level setting circuit; and a switch for selectively providing the user control signal or the output of said integrator to said adjusting means.

21. The receiver in accordance with claim 19, wherein said adjusting means comprises:

a first adjusting circuit responsive to the control signal for adjusting the gain of said variable gain amplifier; and a second adjusting circuit responsive to the control signal for adjusting the level set by said level setting circuit.

22. The receiver in accordance with claim 21, wherein the control signal output by said detecting means varies from a first to a second voltage and wherein said first adjusting circuit adjusts the gain of said variable gain amplifier from an initial value to a minimum value when the control signal varies from the first voltage to a third voltage intermediate the first and second voltages; and said second adjusting circuit adjusts the level set by said level setting circuit from a minimum attenuation to a maximum attenuation when the control signal varies from the third voltage to the second voltage.

23. The receiver in accordance with claim 22, wherein the gain of said variable gain amplifier remains at the minimum value when the control signal varies from the third voltage to the second voltage and the attenuation of said level setting circuit remains at the minimum attenuation when the control signal varies from the first voltage to the third voltage.

24. A receiver for a fiber communications system comprising first and second receiving units for receiving respective optical signals and outputting respective composite electrical signals and a combiner for combining the outputs of said first and second receiving units into a single output composite electrical signal, each of said first and second receiving units comprising a photodetector for converting a received optical signal to a composite electrical signal, a variable gain amplifier for variably amplifying the composite electrical signal output by said photodetector, a level setting circuit for variably setting a level of a composite electrical signal output by said variable gain amplifier, detecting means for detecting the composite electrical signal output by said level setting circuit and outputting a control signal based on a level of a pilot portion of the detected electrical signal, and adjusting means responsive to the control signal for adjusting said variable gain amplifier and said level setting circuit.

25. A fiber optics communications system, comprising:

a transmitter for transmitting an optical signal, said transmitter comprising:

an input terminal for receiving a composite electrical signal;

level setting circuitry for variably setting a level of the composite electrical signal supplied to said input terminal;

a laser responsive to a composite electrical signal output by said level setting circuitry for outputting a modulated optical signal corresponding to the composite electrical signal supplied to said input terminal;

detecting means for detecting the composite electrical signal output by said level setting circuitry and outputting a control signal based on a composite level of the detected electrical signal; and adjusting means responsive to the control signal for adjusting said level setting circuitry; and a receiver for receiving the optical signal transmitted by said transmitter, said receiver comprising:

a photodetector for converting the received optical signal to a composite electrical signal;

level setting circuitry for variably setting a level of a composite electrical signal output by said photodetector;

an output terminal for outputting a composite electrical signal output by said level setting circuitry as an output composite electrical signal corresponding to the received optical signal;

detecting means for detecting the composite electrical signal output by said level setting circuitry and outputting a control signal based on a level of a pilot portion of the detected electrical signal; and adjusting means responsive to the control signal for adjusting said level setting circuitry.

26. A transmitter for use in a fiber communications system, comprising:

an input terminal for receiving a composite electrical signal;

a first level setting circuit for variably setting a level of the composite electrical signal supplied to said input terminal;

a first amplifier for amplifying an output signal of said first level setting circuit;

a second level setting circuit for variably setting a level of an output signal of said first amplifier;

a second amplifier for amplifying an output signal of said second level setting circuit;

a laser responsive to a signal output by said second amplifier for outputting a modulated optical signal corresponding to the received composite electrical signal;

detecting means for detecting the signal output by said second amplifier and outputting a control signal based on a level of the detected signal; and adjusting means responsive to the control signal for adjusting said first and second level setting circuits.

27. The transmitter in accordance with claim 26, wherein said detecting means detects the composite electrical signal output by said second amplifier and outputs a control signal based on a composite level of the detected electrical signal.

28. A receiver for use in a fiber communications system, comprising:

a photodetector for converting a received optical signal to a composite electrical signal;

a first variable gain amplifier for amplifying the composite electrical signal output by said photodetector;

a level setting circuit for setting a level of an output signal of said variable gain amplifier;

a second amplifier for amplifying an output signal of said level setting circuit;

an output terminal for outputting a signal output by said second amplifier;

detecting means for detecting the signal output by said second amplifier and outputting a control signal based on a level of a pilot portion of the detected signal; and adjusting means responsive to the control signal for adjusting said variable gain amplifier and said level setting circuit.

* * * * *

UNITED STATES PATENT AND TRADEMARK OFFICE
CERTIFICATE OF CORRECTION

PATENT NO. : 5,267,071

DATED : November 30, 1993

INVENTOR(S) : Frank R. LITTLE et al.

It is certified that error appears in the above-identified patent and that said Letters Patent is hereby corrected as shown below:

Col. 14,

Claim 7, line 1, change "claim 1" to --claim 6--.

Signed and Sealed this

Twenty-first Day of November, 1995

*Attest:*

BRUCE LEHMAN

*Attesting Officer*     *Commissioner of Patents and Trademarks*